United States Patent [19]

Ahmed

[11] 4,251,778
[45] Feb. 17, 1981

[54] CIRCUIT WITH ELECTRICALLY CONTROLLED GAIN

[75] Inventor: Adel A. A. Ahmed, Clinton Township, Hunterdon County, N.J.

[73] Assignee: RCA Corporation, New York, N.Y.

[21] Appl. No.: 23,965

[22] Filed: Mar. 26, 1979

[51] Int. Cl.³ ............................................. H03G 3/30
[52] U.S. Cl. .................................... 330/279; 330/288; 330/289
[58] Field of Search ........................ 330/279, 288, 289

[56] References Cited

U.S. PATENT DOCUMENTS

| 3,828,266 | 8/1974 | Okada et al. ......................... 330/285 |
| 4,055,774 | 10/1977 | Ahmed ............................. 330/296 X |

Primary Examiner—James B. Mullins
Attorney, Agent, or Firm—E. M. Whitacre; A. L. Limberg

[57] ABSTRACT

A gain control circuit includes a first transistor with direct-coupled collector-to-base feedback converting current, applied to its collector, to logarithmically related voltage appearing between its emitter and base. This logarithmically related voltage is incremented or decremented by a voltage $\Delta V_1$ proportional to T and applied to the emitter-base junction of a second transistor used as a logarithm of voltage to current converter, T being an absolute temperature close to that at which the first and second transistors are operated. $\Delta V_1$ is developed as the potential drop across a resistive element R1, responsive to the output current of a current-to-logarithm-of-current converter circuit, making the conversion with a scaling factor proportional to T divided by the resistance $R_1$ of resistive element R1. Accordingly, the gain setting of the gain control circuit is unaffected by change in T.

8 Claims, 7 Drawing Figures

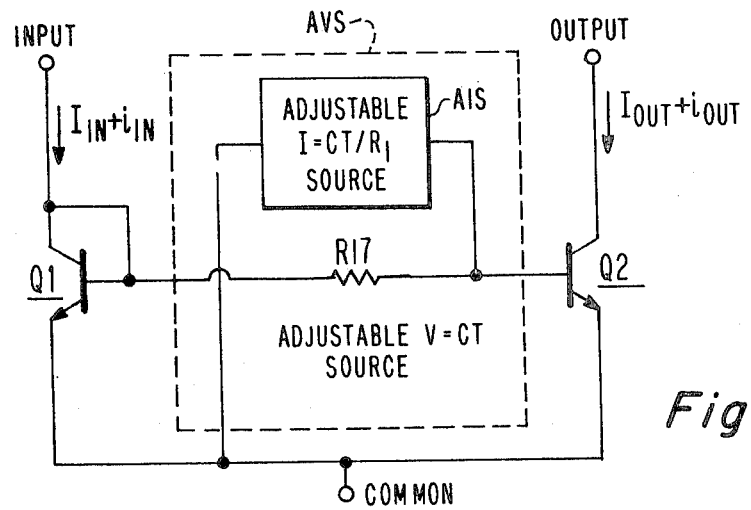
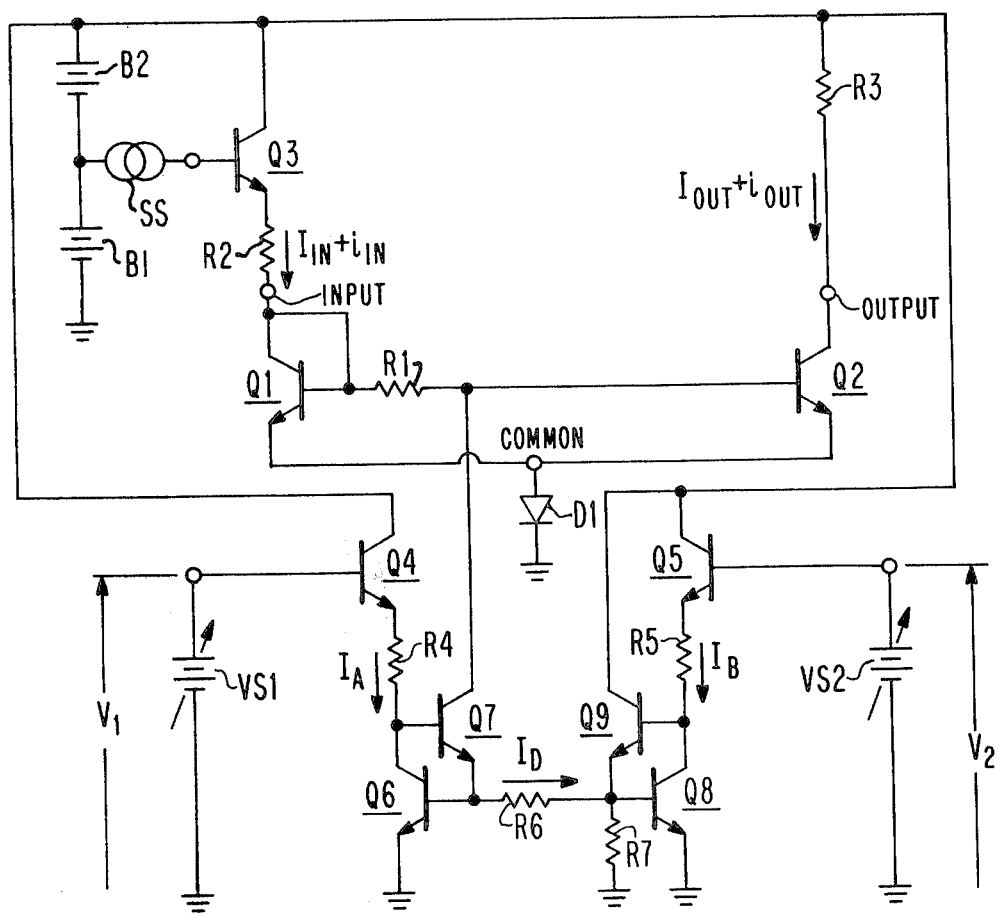

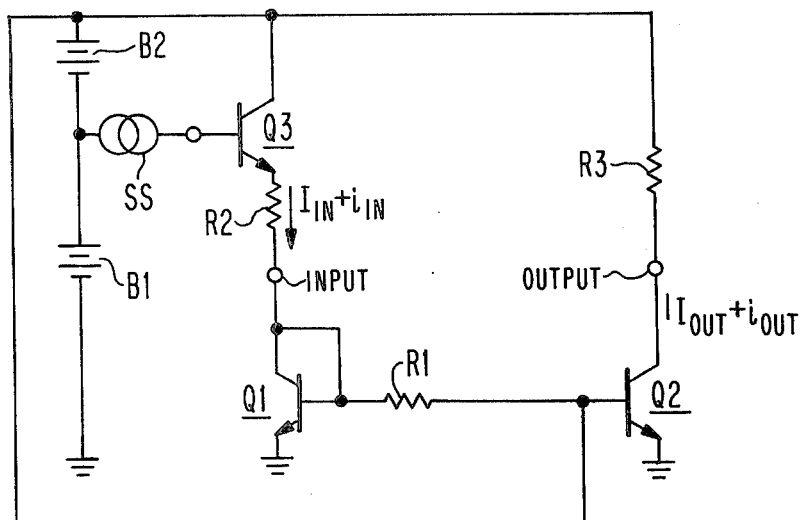
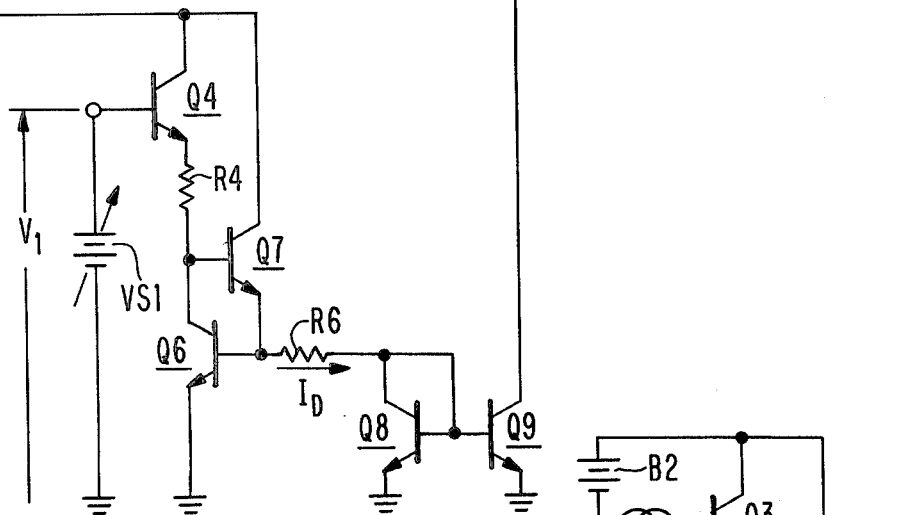
Fig. 6.
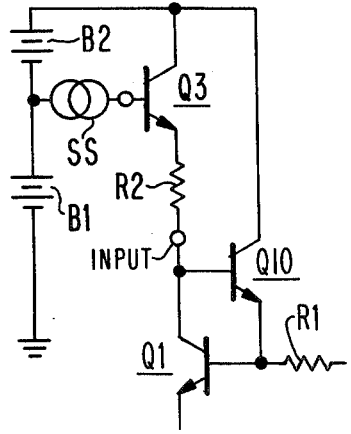
Fig. 7.

CIRCUIT WITH ELECTRICALLY CONTROLLED GAIN

The present invention relates to gain control circuits for providing a proportional response to applied electrical input signals, the proportionality factor being adjustable responsive to an electrical control signal.

Okada, et al. in U.S. Pat. No. 3,828,266 issued 6 Aug. 1974 and entitled "SIGNAL CONTROL CIRCUIT" describe a gain control circuit in which input signal currents are applied to a first, diode-connected transistor to develop a logarithmically related potential. This potential is decremented by the potential drop across a resistor and then applied as the emitter-to-base potential of a second transistor. The collector current of the second transistor is anti-logarithmically related to its emitter-to-base potential and thus is proportionally related to the input signal current divided by a factor dependent on the potential drop across the resistor. In the Okada, et al. circuit this potential drop is developed in response to an automatic gain control (AGC) current. The Okada, et al. circuit presents a problem if one attempts to apply gain control current that is developed other than by a closed feedback loop, such as an AGC loop, in that the gain control changes gain with change in the temperature of the first and second transistors.

A.A.A. Ahmed in U.S. Pat. No. 4,055,774 issued 25 Oct. 1977 and entitled "CURRENT SCALING APPARATUS" describes current scaling apparatus in which input currents are applied to a first, diode-connected transistor to develop a logarithmically related potential. This potential is incremented or decremented by the potential drop across a first resistor and then applied as the emitter-to-base potential of a second transistor. The potential drop across the first resistor is scaled to the potential drop across a second resistor to which is applied the difference in the emitter-to-base offset potentials of third and fourth transistors, the emitter-base junctions of which are operated at different current densities. This provides a potential drop across the first resistor that varies in proportion to the absolute temperature at which the transistors are all operated. Owing to this, the collector current of the second transistor, anti-logarithmically related to the emitter-to-base potential of that transistor, is related in temperature-independent proportion to the input signal current. It was discerned by the present inventor that it would be useful if one could obtain such temperature-independent current scaling in signal control circuits with adjustable current gain, so they might be operated at constant gain settings without having to be in a direct-coupled feedback loop.

The present invention is embodied in gain control circuits similar to those described by Okada, et al., but in which the base electrodes of the first and second transistors are differentially biased by an adjustable voltage providing a voltage substantially directly proportional to an absolute temperature T close to which the first and second transistors are operated. This can be done, for example, by replacing the AGC current source of Okada, et al. with an adjustable current source providing a current that is proportional to the absolute temperature at which the first and second transistors are operated and is inversely proportional to the resistance of the first resistor.

In the drawing:

FIG. 1 is a simplified schematic diagram, partially in block form, showing the general form of gain control circuits embodying the present invention;

FIGS. 2, 3, 4, 5 and 6 are each a schematic diagram of a specific form of gain control circuit embodying the present invention; and FIG. 7 shows a modification that may be made to any of the gain control circuits of FIGS. 2, 3, 4, 5 and 6.

Figure 3:
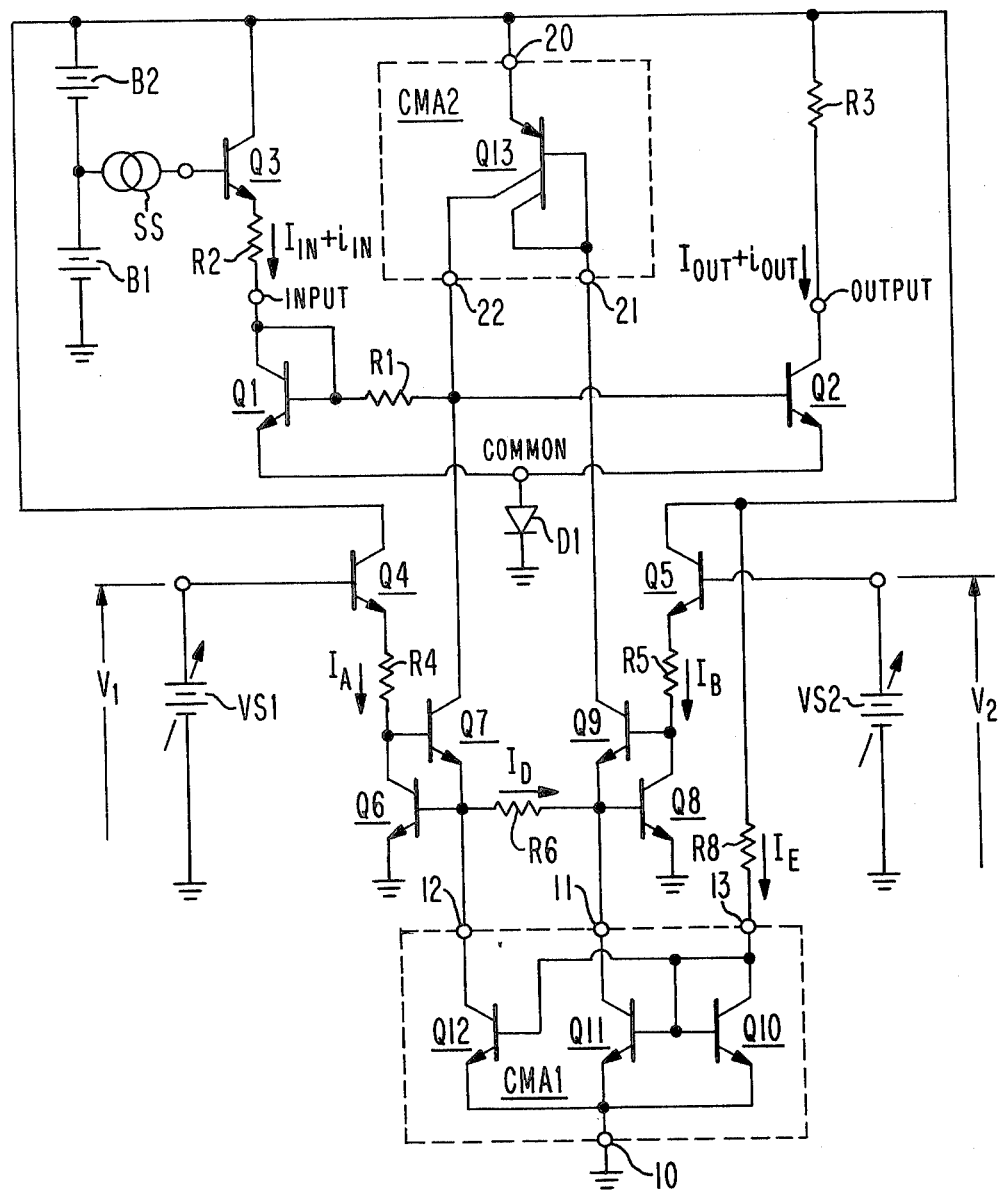

In FIG. 1 the first and second transistors Q1 and Q2 are of NPN conductivity type with their respective collector electrodes at INPUT and OUTPUT terminals respectively and with their respective emitter electrodes connected at a COMMON terminal. Q1 is provided with direct-coupled collector-to-base feedback connection for adjusting its emitter-to-base potential $V_{BEQ1}$ so as to condition Q1 to conduct a current applied the INPUT terminal. Assuming current flow through the collector-to-base feedback connection to be negligibly small compared to the collector current $I_{CQ1}$ of Q1, this input current can be identified with $I_{CQ1}$. This input current (and thus $I_{CQ1}$) comprises a signal component $i_{IN}$ superimposed on a direct or quiescent component $I_{IN}$. An adjustable voltage source AVS provides a voltage $\Delta V_2 = CT$ which, when not zero-valued, is proportionally related by a constant factor C to an absolute temperature T close to the operating temperatures of Q1 and Q2. This voltage is either additively or subtractively combined with $V_{BEQ1}$ to determine the emitter-to-base voltage $V_{BEQ2}$ of Q2. Q2 responds to $V_{BEQ2}$ to demand a collector current at the OUTPUT terminal, which current has a signal component $i_{OUT}$ superimposed on a direct or quiescent component $I_{OUT}$.

The operation of the FIG. 1 circuit may be described more particularly proceeding from application of Kirchoff's Law of Voltages to write equation 1, following $$V_{BEQ1} + \Delta V_1 = V_{BEQ2} \tag{1}$$

One may substitute values for $V_{BEQ1}$ and $V_{BEQ2}$ obtained from the well-known equation, following, describing transistor action in a transistor QN, N being an integer identifying the transistor.

$$V_{BEQN} = (kT/q) \ln (I_{CQN}/J_S A_{QN}) \tag{2}$$

wherein:

$V_{BEQN}$ is the emitter-to-base voltage of QN;

k is Boltzmann's constant;

T is the absolute temperature at which the emitter-base junction of QN operates;

q is the charge on an electron;

$I_{CQN}$ is the collector current of QN;

$J_S$ is the density of current flow through QN when $V_{BEQN}$ is zero-valued; and $A_{QN}$ is the effective area of the emitter-base junction of QN. Transistors monolithically integrated with similar diffusion profiles will have substantially the same $J_S$ and if proximately located in the monolithic die will operate at temperatures close to the same value T. Substituting for $V_{BEQ1}$ and $V_{BEQ2}$ in equation 1 from equation 2 and substituting CT for $\Delta V_1$, one obtains equation 3, following, which can be simplified to obtain equation 4, also following.

$$(kT/q) \ln (I_{CQ1}/J_S A_{Q1}) + CT = (kT/q) \ln (I_{CQ2}/J_S A_{Q2}) \quad (3)$$

$$(I_{CQ2}/I_{CQ1}) = (A_{Q2}/A_{Q1}) \exp (Cq/k) \quad (4)$$

Note that the current gain ($I_{CQ2}/I_{CQ1}$) of the FIG. 1 configuration is independent of temperature and can be adjusted by adjusting C. Note, too, that logarithmic change in C results in linear change in the current gain ($I_{CQ2}/I_{CQ1}$).

The adjustable voltage source is shown in FIG. 1 as comprising an adjustable current source AIS and a resistive element R1. R1 with resistance $R_1$ is connected between the base electrodes of Q1 and Q2. Adjustable current source AIS causes a current proportional to $T/R_1$ to flow through $R_1$ to develop CT as a voltage drop thereacross.

FIG. 2 shows in detail circuitry used with a gain control circuit as generally shown in FIG. 1. The COMMON terminal is offset in potential from a reference voltage, ground, by the offset potential across a diode D1 forward-biased by the combined input current ($I_{IN} + i_{OUT}$) and output current ($I_{OUT} + i_{OUT}$). This offset potential has a substantially fixed value close to $V_{BE}$ and with $V_{BEQ1}$ added tends to maintain the INPUT terminal at a nominally $2V_{BE}$ value. The input current $I_{IN} + i_{IN}$ is generated, for example, as shown, by applying an input voltage to the base electrode of an NPN emitter-follower transistor Q3 having its emitter electrode connected via resistive element R2 with resistance $R_2$ to the terminal INPUT. This input voltage consists of a direct component $V_{IN}$ developed across the direct voltage source B1, upon which direct component is superimposed a signal component $v_{IN}$ developed between the positive pole of B1 and the base of Q3 by signal voltage since SS. The emitter potential of Q3 is less than its base potential $V_{IN} + v_{IN}$ by its emitter offset potential $V_{BEQ3}$, so R2 has a potential drop $V_{IN} + v_{IN} - 3V_{BE}$ thereacross, $I_{IN} + i_{IN}$ will then by Ohm's Law have a value $(V_{IN} + v_{IN} - 3V_{BE})/R_2$.

B1 has another direct voltage source B2 serially connected therewith providing a positive operating voltage. This voltage is applied to the collector electrodes of NPN emitter-follower transistors Q3, Q4, Q5 and Q9 and to the first end of a resistive element R3 connected at its other end to the terminal OUTPUT. R3 provides a collector load resistance for Q2 across which the $I_{OUT} + i_{OUT}$ collector current of Q2 develops an output voltage in accordance with Ohm's Law. Voltage supplies VS1 and VS2 apply bias voltages $V_1$ and $V_2$, respectively, to the base electrodes of Q4 and Q5, respectively. At least one of these voltage sources VS1 and VS2 is adjustable to provide a range of bias voltage as a control voltage.

Grounded-emitter NPN transistor Q6 is provided direct-coupled collector-to-base feedback by the emitter-follower action of another NPN transistor Q7, which feedback regulates the emitter-to-collector potential $V_{CEQ6}$ of Q6 to a value equal to the sum of the emitter-to-base voltages $V_{BEQ6}$ and $V_{BEQ7}$ of Q6 and Q7. The emitter potential $V_{EQ4}$ of Q4 is less than its base potential $V_{BQ4} = V_1$ by its emitter-to-base offset voltage $V_{BEQ4}$. Resistor R4 with resistance $R_4$ connects the emitter of Q4 to the collector of Q6, and current $I_A$ flows through R4 sufficient to cause a potential drop $V_1 - V_{BEQ4} - V_{BEQ6} - V_{BEQ7}$ thereacross. That is, $I_A$ has a value $(V_1 - V_{BEQ4} - V_{BEQ6} - V_{BEQ7})/R_4$; and, assuming the base current of Q7 to be negligibly small, $I_A$ is identifiable as the collector current $I_{CQ6}$ of Q6. So the value of $V_{BEQ6}$ can be determined from equation 2 to be substantially as follows.

$$V_{BEQ} = (kT/q) \ln (I_{CQ6}/J_S A_{Q6}) = (kT/q) \ln (I_A/J_S A_{Q6}) = (kT/q) \ln [(V_1 - V_{BEQ4} - V_{BEQ6} - V_{BEQ7})/R_4 J_S A_{Q6}] \quad (5)$$

Grounded-emitter NPN transistor Q8 is provided direct-coupled collector-to-base feedback by the emitter-follower action of another NPN transistor Q9. Resistor R5 with resistance $R_5$ will have a current $I_B$ flowing therethrough of value $(V_2 - V_{BEQ5} - V_{BEQ8} - V_{BEQ9})/R_5$, where $V_{BEQ5}$, $V_{BEQ8}$ and $V_{BEQ9}$ are the emitter-to-base offset potentials of Q5, Q8 and Q9, respectively. Assuming the base current of Q9 to be negligibly small, $I_B$ is identifiable as the collector current $I_{CQ8}$ of Q8. So the value of $V_{BEQ8}$ can be determined from equation 2 to be as follows.

$$V_{VEQ8} = (kT/q) \ln (I_{CQ8}/J_S A_{Q8}) = (kT/q) \ln (I_B/J_S A_{Q8}) = (kT/q) \ln [(V_2 - V_{BEQ5} - V_{BEQ8} - V_{BEQ9})/R_5 J_S A_{Q8}] \quad (6)$$

Knowing the values of $V_{BEQ6}$ and $V_{BEQ8}$ the value of the voltage $\Delta V_2 = V_{BE6} - V_{BQ8}$ appearing between the base electrodes of Q8 and Q6 can be determined.

$$\Delta V_2 = (kT/q) \ln (I_{CQ6} A_{Q8}/I_{CQ8} A_{Q6}) = (kT/q) \ln [(I_A/I_B)(A_{Q8}/A_{Q6})] = (kT/q) \ln [(V_1 - V_{BEQ4} - V_{BEQ6} - V_{BEQ7})R_5 A_{Q8}/(V_2 - V_{BEQ5} - V_{BEQ8} - V_{BEQ9})R_4 A_{Q6}] \quad (7)$$

This $\Delta V_2$ potential is applied across resistive element R6 having resistance $R_6$ to cause in accordance with Ohm's Law a current $I_D$ through $R_6$ of the following value.

$$I_D = (\Delta V_2/R_6) = (kT/qR_6) \ln [(I_A/I_B)(A_{CQ8}/A_{CQ6})] = (kT/qR_6) \ln [(V_1 - V_{BEQ4} - V_{BEQ6} - V_{BEQ7})R_5 A_{CQ8}/(V_2 - V_{BEQ5} - V_{BEQ8} - V_{BEQ9})R_4 A_{CQ6}] \quad (8)$$

Note that $I_D$ has the desired proportional dependence on T divided by resistance. Note also that just as $\Delta V_2$ can be varied by varying $i_A$ and $I_B$ differentially—e.g., by varying $V_1$ and $V_2$ differentially—so can the current $I_D$.

The current $I_D$ flows to ground through resistive element R7, which functions as a current sink. The current $I_D$ is extracted from the emitter of Q7. Q7 by common-base amplifier action demands a collector current $[h_{feQ7}/(h_{feQ7}+1)]$ times as large as $I_D$, where $h_{feQ7}$ is the commons-emitter forward current gain of Q7. Since $h_{feQ7}$ is normally 30 to 200, this collector current is substantially equal to $I_D$ and is withdrawn through R1, diverting a portion of the ($I_{IN} + i_{IN}$) current from flowing through Q1 as collector current. The potential drop $\Delta V_1$ across R1 will, in accordance with Ohm's Law, have a value substantially equal to $R_1$ times $I_D$—i.e., substantially equal to $(R_1/R_6) \Delta V_2$, as expressed in the following equation 9.

$$V_1 = (R1/R_6(kT/q)) \ln [(V_1 - V_{BEQ4} - V_{BEQ6} - V_{BEQ7})R_5 A_{Q8}/(V_2 - V_{BEQ5} - V_{BEQ8} - V_{BEQ9})R_4 A_{CQ6}] \quad (9)$$

Note that $\Delta V_1$ is of the desired C times T form.

For the condition $(I_A/A_{CQ6}) = (I_B/A_{CQ8}) \Delta V_2$, $I_D$ and $\Delta V_1$ will be zero-valued; and the ratio of ($I_{OUT} + i_{OUT}$) to ($I_{IN} + i_{IN}$) will be the same as the ratio of the emitter-base junction area $A_{Q2}$ of Q2 to the emitter-base junction area $A_{Q1}$ of Q1. For the condition ($I_A/A_{CQ}$-

6)<($I_B/A_{CQ8}$) transistor Q7 will also be cut off, making $\Delta V_1$ zero-valued and causing the current gain to be the same as in the ($I_A/A_{CQ6}$)=($I_B/A_{CQ8}$) instance. As $I_A$ is increased relative to $I_B$ to cause ($I_A/A_{CQ6}$) to exceed ($I_B/I_{CQ8}$), however, $\Delta V_1$ is increased, attenuating the ($I_{OUT}+i_{OUT}$) response to ($I_{IN}+i_{IN}$). If R1 equals R6, the gain of the gain control circuit comprising Q1, R1, and Q2 will vary directly as the ratio of ($I_A/A_{CQ6}$) and ($I_B/A_{CQ8}$). However, to provide a larger gain control range without need for a commensurately large ratio between ($I_A/A_{CQ6}$) and ($I_B/A_{CQ8}$), R1 will be made a factor m times larger than R6, m being greater than unity so the gain of the control circuit will vary as the $m^{th}$ power of the ratio of ($I_A/A_{CQ6}$) to ($I_B/A_{CQ8}$).

FIG. 3 shows a modification of the FIG. 2 gain control circuit which extends the range of current gain available by an order or two, since the modification permits operation with $V_{BEQ2}$ larger than (as well as smaller than) $V_{BEQ1}$. R7 is replaced in its sink function by a first output 11 of a dual-output current mirror amplifier CMA1, the second output 12 of which provides a current sink to the emitter electrode of transistor Q7. CMA1 comprises NPN transistors Q10, Q11, and Q12 with emitters at the common connection 10 of CMA1, shown connected to ground reference potential. Q10 is connected as the master mirroring transistor with its collector connected at the input 13 of CMA1 and with direct-coupled collector-to-base feedback for adjusting its emitter-to-base potential $V_{BEQ10}$ to condition it to conduct as collector current substantially all of the current $I_E$ flowing into the input 13 of CMA1. $V_{BEQ10}$ is applied to the base electrodes of slave mirroring transistors Q11 and Q12 for conditioning them to demand collector currents $I_{CQ11}$ and $I_{CQ12}$, respectively, at output connections 11 and 12, respectively, in proportion to $I_E$. These proportions are determined in accordance with equation 2 describing transistor action, and normally $I_{CQ11}$ and $I_{CQ12}$ will be made of equal value by proportioning the areas of the emitter-base junctions of Q11 and Q12 in like ratios to the area of the emitter-base junction of Q10. Assuming CMA1 is a current mirror amplifier of a type which like that shwon regulates the voltage at its input connection, $I_E$ may be generated in accordance with Ohm's Law by simply connecting a resistive element R8 between the input connection of the current mirror amplifier and a point of fixed voltage, such as that provided from the serially-connected direct voltage supplies B1 and B2.

Under conditions where $I_D$ is zero-valued, the current $I_{CQ12}$ demanded at output connection 12 of CMA1 will be coupled by the common-base amplifier action of Q7 to cause it to demand a collector current $I_{CQ7}$ which tends to be withdrawn through R1. This tendancy is, however, counteracted in the following way. The current $I_{CQ11}$ demanded at output connection 11 of CMA1 is coupled by the common-base amplifier action of Q9 to the input connection 21 of another current mirror amplifier CMA2. CMA2 has an output connection 22 to the same end of R1 as the collector of Q7 and supplies the collector current demand of Q7 when $I_D$ is zero-valued. So, no current flows through R1 under $I_D=0$ conditions; $\Delta V_1$ is is zero-valued, and $V_{BEQ2}$ equals $V_{BEQ1}$. CMA2 has its common connection 20 to an appropriate operating potential, such as that afforded by the serially connected direct voltage supplies B1 and B2. CMA2 may, as shown, simply consist of a dual-collector PNP transistor Q13 with collector electrodes at each of input and output connections 21 and 22, emitter electrode at common connection 20, and base electrode to which input connection 21 direct couples—e.g., by direct connection as shown.

Under conditions where $V_{BEQ6}$ exceeds $V_{BEQ8}$ and $I_D$ is positive-valued, the emitter current of Q7 will be incremented by $I_D$ and the emitter current of Q9 will be decremented by $I_D$. $I_{CQ7}$ and $I_{CQ9}$ will be similarly incremented and decremented, respectively, by $I_D$. CMA2 will respond to the $I_D$ decrement of its input current $I_{CQ9}$ with an $I_D$ decrement in its output current. So a current twice $I_D$ in amplitude will flow through R1 in the direction from the base of Q1 to the base of Q2, reducing the current gain of the gain control circuit from that for $I_D=0$ conditions by making $V_{BEQ2}$ smaller than $V_{BEQ1}$.

On the other hand, under conditions where $V_{BEQ8}$ exceeds $V_{BEQ6}$ and $I_D$ is negative-valued, the emitter current of Q7 will be decremented and the emitter current of Q9 will be incremented. In response $I_{CQ7}$ will be decremeted, and $I_{CQ9}$ will be incremented causing the incrementation of the output current of CMA2. A current twice $I_D$ in amplitude will flow through R1 in the direction from the base of Q2 to the base of Q1, increasing the current gain of the gain control circuit from that for $I_D=0$ conditions by making $V_{BEQ2}$ larger than $V_{BEQ1}$.

Figure 4:
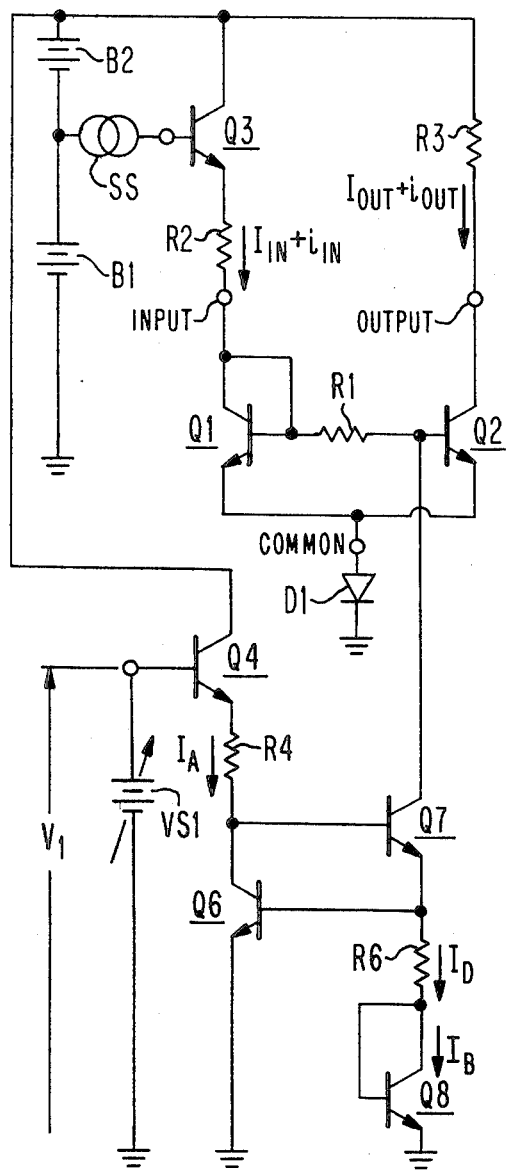

FIG. 4 shows a simplifying modification that can be made in the FIG. 2 circuit when it is sufficient that the current gain of the gain control circuit is decreased and increased in response to increase and decrease respectively of control voltage or current—that is, when the current gain of the control circuit need not be decreased and increased responsive to decrease and increase, respectively, of control voltage or current. In this FIG. 4 configuration $I_B$ essentially equals $I_D$, changing response somewhat for the conditions where $I_A$ is small and thus $I_D$ and $I_D R_6$ are small. This normally is not a serious shortcoming, however, since predictability of gain setting in the gain control circuit is usually of more concern for the larger current attenuation factors. Here, the connection of Q7 and of its eitter-to-base current feedback circuit comprising R6, Q8, and Q6 will be noted to resemble the current-to-logarithm-of-current converter described by C. F. Wheatley, Jr., in U.S. Pat. No. 3,629,691 issued 21 Dec. 1971 and entitled "CURRENT SOURCE". The positions of R6 and diode-connected transistor Q8 in their series connection can, of course, be reversed without affecting the operation of the circuit.

Figure 5:
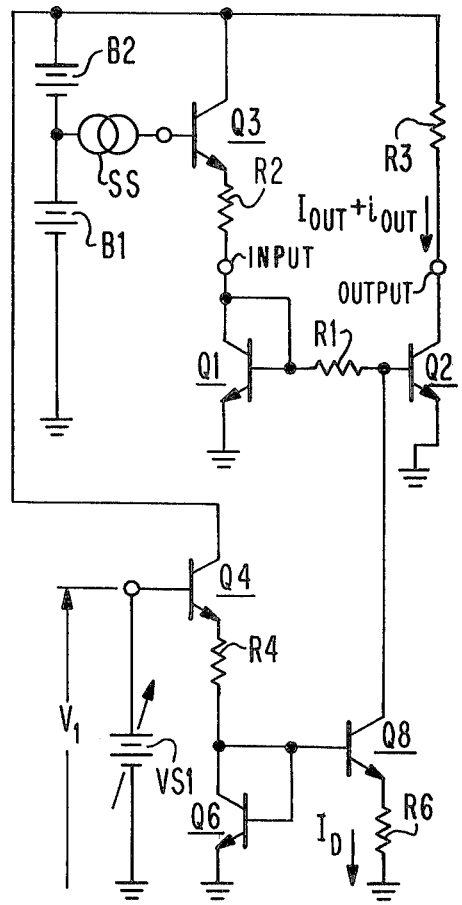

FIGS. 5 and 6 show further modifications that can be made proceeding from the FIG. 4 circuit, which modifications permit the emitter electrodes of NPN transistors Q1 and Q2 to be operated directly connected without potential offset from the least positive potential in the circuit. In FIG. 5, the series connection of R6 and diode-connected transistor 8 with relative positions reversed from that shown in FIG. 4, mentioned above, is modified to eliminate the need for Q7. Q6 is provided collector-to-base feedback by impedance-free direct connection; and the collector electrode of Q8 no longer connects to the base of Q6, but rather to the base of Q2 to withdraw collector current substantially equal to $I_D$ through R1. These connections result in diode-connected Q6, Q8, and R6 functioning as a current-to-logarithm-of-current converter, as described by A. B. Glaser and G. E. Sharpe in their letter "On the Temperature Behavior of the Logarithmic Integrated Circuit Current Source", *IEEE Journal of Solid State Circuits*, Aug. 1975, pp. 250, 251. In FIG. 6 current demand substantially equal to $I_D$ is made at the base of Q2, not from the collector electrode of Q7 owing to its common-base amplifier action, but rather from the collector electrode of an NPN transistor Q9 owing to its common-emitter action in its current mirror amplifier connection with diode-connected transistor Q8. The current-to-logarithm-of-current converter formed by Q6, Q7, R6, Q8 and Q9 resembles the current attenuator described by A.A.A. Ahmed in U.S. Pat. No. 3,921,013 issued Nov. 18, 1975, and entitled "BIASING CURRENT ATTENUATOR". Alternatively, Q6 may be provided collector-to-base feedback by impedance-free direct connection, rather than by the emitter-follower action of Q7, and Q7 dispensed with.

FIG. 7 shows how the effect of $I_D$ in diverting a portion of the ($I_{IN}+i_{IN}$) current from flowing as collector current to Q1 can be avoided by inserting an NPN emitter-follower transistor Q10 in the direct-coupled collector-to-base feedback connection of Q1. This permits R1 to be made lower in resistance to improve operating point stability in the collector circuit of Q2, and permits the collector current of Q7 to be scaled upward to maintain the same control range, while not having to reduce dynamic range for signal by having to accompany $i_{IN}$ with an increased $I_{IN}$ component to accommodate the increased collector current demand of Q7.

One skilled in the art of the electronic circuit design and armed with the foregoing disclosure will be readily able to design other embodiments of the present invention, and the scope of the following claims should be construed bearing this in mind.

What we claim is:

1. A gain control circuit comprising:
   input, output, and common terminals;
   first and second transistors of like conductivity type arranged to operate at similar absolute temperatures close to temperature T, having respective collector electrodes respectively connected to said input terminal and to said output terminal, having respective emitter electrodes connected to said common terminal, and having respective base electrodes;
   direct coupled collector-to-base feedback means between the collector and base electrodes of said first transistor for conditioning said first transistor to conduct as collector current substantially all of any current applied to said input terminal;
   adjustable voltage source means for providing a voltage substantially directly proportional to T between the base electrodes of said first and second transistors.

2. A gain control circuit as set forth in claim 1 wherein said adjustable voltage source means includes:
   a first resistor having a resistance $R_1$ between its first and second ends respectively connected to the base electrode of said first transistor and to the base electrode of said second transistor; and
   adjustable current source means connected to said first resistor for causing a first control current flow therethrough.

3. A gain control circuit as set forth in claim 2 having first and second supply terminals for receiving an operating potential therebetween, having means relating the potential at said common terminal to that at one of said supply terminals, and including in said adjustable current source means the following:
   a second resistor having a resistance proportional to $R_1$ between its first and second ends,
   third, fourth, and fifth transistors of like conductivity type having respective collector and emitter and base electrodes, said third and fourth transistors having their emitter electrodes connected to said first supply terminal and having their base electrodes respectively connected to the first end of said second resistor and to the second end of said second resistor, said fifth transistor having its collector electrode connected to the second end of said first resistor;
   means for applying a second control current to a first node to which the collector electrode of said third transistor connects, means for applying a third control current to a second node to which the collector electrode of said fourth transistor connects and means for adjusting the value of at least one of said second and third control currents;
   means direct coupling said first node to the base electrode of said third transistor, completing a feedback loop for conditioning said third transistor to conduct as collector current substantially all of said second control current; and
   means direct coupling said second node to the base electrode of said fourth transistor, completing a feedback loop for conditioning said fourth transistor to conduct as collector current substantially all of said third control current, which means includes connection of said second node to the base electrode of said fifth transistor and includes connection of the emitter electrode of said fifth transistor to the base electrode of said fourth transistor.

4. A gain control circuit as set forth in claim 3 including:
   a sixth transistor of the same conductivity type as said third, fourth, and fifth transistors and with collector, emitter, and base electrodes, said means direct coupling said first node to the base electrode of said third transistor including connection of said first node to the base electrode of said sixth transistor and including connection of the emitter electrode of said sixth transistor to the base electrode of said third transistor; and
   means connecting the collector electrode of said sixth transistor to said second supply terminal.

5. A gain control circuit as set forth in claim 4 including:
   current amplifier means, having an input circuit connected between the collector electrode of said sixth transistor and said second supply terminal and thus included in said means connecting the collector electrode of said sixth transistor to said second supply terminal, having an output circuit connected between said second supply terminal and the second end of said first resistor, and exhibiting a current gain of substantially minus unity between its input and output circuits;
   means for applying a first bias current to the emitter electrode of said fifth transistor; and
   means for applying a second bias current to the emitter electrode of said sixth transistor, which second bias current is of substantially the same value as said first bias current.

6. A gain control circuit as set forth in claim 2 having first and second supply terminals for receiving an operating potential therebetween, having means relating the potential at said common terminal to that at one of said supply terminals, and including in said adjustable current source means the following:

a second resistor having a resistance proportional to $R_1$ between its first end and its second end;

means for applying a second, adjustable control current to a first node; and third, fourth and fifth transistors of like conductivity type having respective collector and emitter and base electrodes, the collector and emitter electrodes of said third transistor being respectively connected to said first node and to one of said supply terminals, the base electrode of said fourth transistor having said first node connected thereto, the emitter electrode of said fourth transistor being connected to the base electrode of said third transistor without substantial intervening impedance and to the emitter electrode of said third transistor through a series connection of said second resistor and a forward-biased diode means formed by the parallelled base-emitter and collector-emitter paths of said fifth transistor, and the collector electrode of said fourth transistor being connected to the second end of said first resistor.

7. A gain control circuit as set forth in claim 2 having first and second supply terminals for receiving an operating potential therebetween, having means relating the potential as said common terminal to that at one of said supply terminals, and including in said adjustable current source means the following:

a second resistor having a resistance proportional to $R_1$ between its first end and its second end;

means for applying a second, adjustable control current to a first node;

third and fourth transistors of like conductivity type having respective emitter electrodes respectively connected to the first end of said second resistor and to the second end of said second resistor, having respective collector electrodes respectively connected to said first node and to the second end of said first resistor, and having respective base electrodes to which a second node connects, the emitter electrodes of said third and fourth transistors being connected to one of said supply terminals by means respectively exclusive of and inclusive of said second resistor; and means direct coupling said first node to said second node, completing a feedback loop for conditioning said fourth transistor to conduct as collector current substantially all of said second control current.

8. A gain control circuit as set forth in claim 2 having first and second supply terminals for receiving an operating potential therebetween, having means relating the potential at said common terminal to that at one of said supply terminals, and including in said adjustable current source means the following:

means for applying a second, adjustable control current to a first node;

third, fourth, and fifth transistors of like conductivity type having respective collector and emitter and base electrodes, their emitter electrodes being connected together and to one of said supply terminals, the collector electrode of said third transistor being connected to said first node and being direct coupled to its base electrode, the collector electrode of said fourth transistor being direct coupled to an interconnection of the base electrodes of said fourth and fifth transistors, the collector-electrode of said fifth transistor being connected to the first end of said first resistor; and a second resistor having a resistance proportional to $R_1$ between its first end, which is connected at the base electrode of said third transistor, and its second end, which is connected at said interconnection of the base electrodes of said fourth and fifth transistors.

* * * * *